United States Patent [19]

Miyazaki

[11] Patent Number: 5,415,951
[45] Date of Patent: May 16, 1995

[54] METHOD OF MANUFACTURING A PHOTOMASK COMPRISING A PHASE SHIFTER WITH A STEPPED EDGE

[75] Inventor: Junji Miyazaki, Itami, Japan

[73] Assignee: Mitsubishi Denki Kabushiki Kaisha, Tokyo, Japan

[21] Appl. No.: 47,463

[22] Filed: Apr. 19, 1993

[30] Foreign Application Priority Data

Apr. 27, 1992 [JP] Japan .................. 4-107578
Feb. 22, 1993 [JP] Japan .................. 5-031534

[51] Int. Cl.⁶ .................................. G03F 9/00
[52] U.S. Cl. ............................. 430/5; 430/321; 430/322; 430/324
[58] Field of Search ............... 430/5, 321, 324, 322

[56] References Cited

U.S. PATENT DOCUMENTS 5,229,255  7/1993  White ........................ 430/22
5,281,500  1/1994  Cathey et al. ................ 430/5

FOREIGN PATENT DOCUMENTS 62-50811  10/1987  Japan .
1-147458   6/1989  Japan .
4254855    9/1992  Japan .

OTHER PUBLICATIONS

"Improving Resolution in Photolithography with a Phase-Shifting Mask", Marc D. Levenson, et al., Ieee Transactions On Electron Devices, vol. ED-29, No. 12, Dec. 1982, pp. 1828-1836.

Primary Examiner—S. Rosasco
Attorney, Agent, or Firm—Oblon, Spivak, McClelland, Maier & Neustadt

[57] ABSTRACT

In a photomask, phase shifting members can be arranged all over a transfer pattern regardless of the configuration of the transfer pattern without exception. The phase shifting members are each formed in a multilayer structure in which a first and a second phase shifting members are stacked one atop the other. The phase shifting angles of the first and the second phase shifting members are each smaller than 180 degrees but equal to 180 degrees in total. In an edge region of the phase shifting member not adjacent to a light shielding member, the overlying second phase shifting member extends over an edge of the underlying first phase shifting member and onto a transparent substrate. The edge of the second phase shifting member is finished in a tapering configuration by thermal treatment. Where the first and the second phase shifting members are in a stack, according to the principles of the phase shift method, a high resolution is yielded. At the edge region of the phase shifting member wherein the first phase shifting member extends over the edge of the second phase shifting member, the intensity of light transmitted therethrough would not drop to zero.

17 Claims, 23 Drawing Sheets

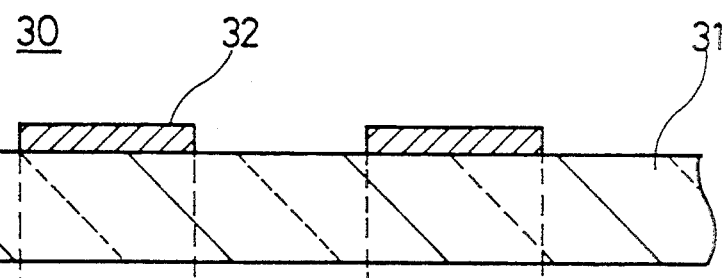
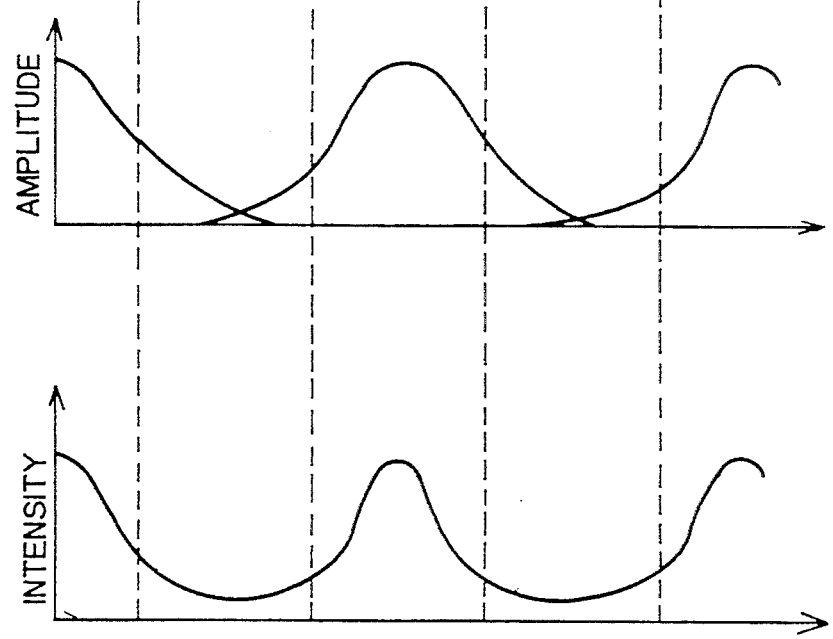
FIG. 14A
FIG. 14B
FIG. 14C

METHOD OF MANUFACTURING A PHOTOMASK COMPRISING A PHASE SHIFTER WITH A STEPPED EDGE

BACKGROUND OF THE INVENTION

1. Field of the Invention

The present invention relates to a method of manufacturing a photomask which is used in lithographic process during fabrication of a semiconductor device or the like.

2. Description of the Prior Art

A photomask for use in lithographic process in general includes a predetermined transfer pattern which consists of a portion transparent to illuminated light and a portion opaque to the illuminated light. The transfer pattern formed on the photomask is projected by a lens system onto a target substrate which includes a photosensitive material layer, and eventually transferred onto the photosensitive material layer.

FIG. 13 is a cross sectional view of a conventional photomask. On a transparent substrate 31 made of glass or other suitable material, light shielding members 32 made of Cr, MoSi and the like are formed. A transfer pattern is formed by the light shielding members 32.

The conventional photomask 30 is manufactured in the following manner, for example. A first step of fabrication is formation of a thin chromium film 33 on the transparent substrate 31 and an E-beam-sensitive resist layer 34 on the thin chromium film 33 (FIG. 10). Next, a predetermined pattern is drawn with an electron beam 35 on the E-beam-sensitive resist layer 34. This is followed by development by which the E-beam-sensitive resist layer 34 is patterned as shown in FIG. 11. Then, the thin chromium film 33 is etched through the E-beam-sensitive resist layer 34, thereby defining the light shielding members 32 as patterned as shown in FIG. 12. At last, the E-beam-sensitive resist layer 34 is removed so that the photomask 30 as that shown in FIG. 13 is obtained.

In a projected image of the photomask 30, as seen in FIG. 14A which shows the amplitude distribution of transmitted light, due to diffraction, light passed through the transparent substrate 31 of FIG. 14A floods into light shielding areas under the light shielding members 32. Since an actual light intensity is a square of the amplitude, the distribution of the light intensity is as shown in FIG. 14C. Thus, in the conventional photomask, light is present in the light shielding areas which are created by the light shielding members 32, which deteriorates the pattern transfer resolution and hence the transfer accuracy of fine patterns.

As a method of preventing such diffraction-induced deterioration in resolution, the phase shift method is well known in the art. The phase shift method requires that a photomask 50 has a transfer pattern in which transparent parts T1, T2 . . . and light shielding parts S1, S2, S3 . . . are alternately arranged and that a phase shifting member 53 is disposed on every other transparent part as shown in FIG. 15. That is, in the transparent part T2, the phase shifting member 53 is formed on the transparent substrate 51 between adjacent light shielding members 52. The phase shifting members 53 each have a thickness which gives rise to 180-degree phase difference between light therethrough and light not therethrough.

Hence, light passed through the transparent parts T1 and T2 and flooding under the light shielding part S2 interfere and cancel each other. A result is an improved resolution.

The photomask 50 of FIG. 15 is manufactured in the following manner, for example. First, similarly to fabrication steps as those shown in FIGS. 10 to 13, the light shielding member 52 having a predetermined pattern is formed on the transparent substrate 51 as shown in FIG. 16. Next, a transparent film 54 made of glass, for instance, is formed on the transparent substrate 51 and the light shielding member 52 as shown in FIG. 17. The transparent film 54 is then covered with a resist layer and subjected to drawing with an electron beam or the like, thereby transferring a pattern onto the resist layer. The pattern is then developed so that a resist pattern 55 is obtained which consists of resist layers each disposed on every other transparent part not covered with the light shielding member 52 (FIG. 18). The transparent film 54 is etched using the resist pattern 55 as a mask, whereby the phase shifting members 53 patterned as shown in FIG. 19 are formed. The resist pattern 55 is removed, completing the photomask 50 as that shown in FIG. 15.

The resist photomask 50 of FIG. 15, however, cannot avoid direct contact of an edge portion of the phase shifting member 53 and the transparent substrate 51 at an edge portion of the transfer pattern, e.g., a region indicated at the reference character E in FIG. 20A. Since light passed through both the transparent substrate 51 and the phase shifting member 53 is 180 degrees out of phase with light passed through only the transparent substrate 51 (FIG. 20B), troublesome zero light intensity occurs in the region indicated at E as shown in FIG. 20C. Hence, when the transfer pattern of the photomask 50 as that shown in FIG. 21A is transferred onto, for example, a positive resist 56 formed on a semiconductor substrate, the resist 56 will not be patterned into the configuration as that shown in FIG. 9B as it should be. Instead, the resist 56 will become as shown in FIG. 21B in which unnecessary residual resist exists where it should not exist (i.e., where the unwanted zero light intensity is created).

A transfer pattern actually used in fabrication of a semiconductor device is a finite pattern and therefore naturally has edges. Hence, the phase shift method inevitably creates residual resist in the edge regions. Only solution to this problem is not to dispose the phase shifting member in the edge regions of the pattern. Thus, the phase shift method does not allow that the phase shifting members are arranged entirely over the transfer pattern, deteriorating the resolution where there is no phase shifting member disposed.

SUMMARY OF THE INVENTION

A method of manufacturing a photomask according to a first aspect of the invention comprises the steps of: preparing a transparent substrate which is pervious to light; selectively forming a light shielding member which is impervious to light on the transparent substrate; and forming a phase shifting member adjacent to the light shielding member and on the transparent substrate, the phase shifting member shifting the phase of light which is transmitted therethrough. The step of forming the phase shifting member includes the steps of stacking first to N-th phase shifting members in this order on the transparent substrate where N is an integer larger than 2 in such a manner that in a region not adjacent to the light shielding member, an edge of a K-th phase shifting member extends over an edge of a (K−1)-th phase shifting member and onto the transparent substrate where K is an integer satisfying 2≦K≦N. The phase shifting angles of the first to the N-th phase shifting members are each smaller than 180 degrees but equal to 180 degrees in total.

In a second aspect of the invention, the step of stacking first to N-th phase shifting members in this order on the transparent substrate includes the step of making an edge region of the phase shifting members stacked on the transparent substrate less steep by thermal treatment.

In a third aspect of the invention, the step of making the edge region of the phase shifting members less steep by thermal treatment includes the step of thermally treating the phase shifting members after formation of the N-th phase shifting member.

A material of the N-th phase shifting member may include optical glass.

In a fourth aspect of the invention, the step of making the edge region of the phase shifting members less steep by thermal treatment includes the step of performing thermal treatment once after formation of each one of the first to the N-th phase shifting members so that each one of the first to the N-th phase shifting member has a less steep edge.

A material of the first to the N-th phase shifting members may include optical glass.

In a fifth aspect of the invention, the step of stacking first to N-th phase shifting members in this order on the transparent substrate includes the step of making the edge region of the phase shifting members less steep by etching in which the phase shifting members are etched both perpendicularly and parallel to a top surface of the transparent substrate at one time.

The step of making the edge region of the phase shifting members less steep by etching includes the steps of: forming a film for use in formation of the N-th phase shifting member; forming a resist pattern on the film for use in formation of the N-th phase shifting member; and performing etching which uses the resist pattern as a mask and in which the phase shifting members are etched both perpendicularly and parallel to a top surface of the transparent substrate at one time, whereby the N-th phase shifting member is formed to have a less steep edge.

In the fifth aspect of the invention, the etching includes isotropic etching.

The step of making the edge region of the phase shifting members less steep by etching preferably includes the steps of: forming the first to the N-th phase shifting members in this order; forming a film for use in formation of the first to the N-th phase shifting members; forming a resist pattern on the film for use in formation of the first to the N-th phase shifting members; and performing etching which uses the resist pattern as a mask and in which the phase shifting members are etched both perpendicularly and parallel to a top surface of the transparent substrate at one time, whereby the first to the N-th phase shifting members are each formed to have a less steep edge.

In the preceding preferable aspect, the etching includes isotropic etching.

A method of manufacturing a photomask according to a sixth aspect of the invention comprises the steps of: preparing a transparent substrate which is pervious to light; selectively forming a light shielding member which is impervious to light on the transparent substrate; forming a phase shifting member adjacent to the light shielding member and on the transparent substrate, the phase shifting member shifting the phase of light which is transmitted therethrough; and making an edge region of the phase shifting member less steep by thermal treatment.

The phase shifting member preferably includes a phase shifting material light through which is 180 degrees out of phase from light not through the phase shifting material.

A material of the N-th phase shifting member may include optical glass.

A method of manufacturing a photomask according to a seventh aspect of the invention comprises the steps of: preparing a transparent substrate which is pervious to light; selectively forming a light shielding member which is impervious to light on the transparent substrate; forming a phase shifting member adjacent to the light shielding member and on the transparent substrate, the phase shifting member shifting the phase of light which is transmitted therethrough; and making an edge region of the phase shifting member less steep by etching in which the phase shifting member are etched both perpendicularly and parallel to a top surface of the transparent substrate at one time.

The phase shifting member preferably includes a phase shifting material light through which is 180 degrees out of phase from light not through the phase shifting material.

In the seventh aspect of the invention, the etching may include isotropic etching.

In a first aspect of the invention, the phase shifting angles of the first to the N-th phase shifting members are 180 degrees in total. Hence, where the first to the N-th phase shifting members are stacked in this order one atop the other on the transparent substrate, a high resolution is obtained according to the principles of the known phase shift method. When taken individually, the phase shifting angles of the first to the N-th phase shifting members are each smaller than 180 degrees. Hence, drop in the light intensity down to zero would not occur where the K-th phase shifting member extends over the edge of the underlying (K−1)-th phase shifting member and onto the transparent substrate. The reason is as follows. At around an edge of the (K−1)-th phase shifting member, since the overlying K-th phase shifting member has a smoothly sloping surface, light intensity drop is small. On the other hand, where the edge of the topmost N-th phase shifting member is in direct contact with the transparent substrate, too, the phase shifting angle of the N-th phase shifting member is less than 180 degrees, suppressing light intensity drop.

By making the edge region of the phase shifting member less steeper, light intensity drop thereat is better restrained.

In a photomask manufactured according to a second and a third aspects of the invention, the phase shifting members delay the phase of light by 180 degrees. Hence, where the phase shifting members are present on the transparent substrate, according to the principles of the known phase shift method, a high resolution is obtainable. On the other hand, where in the edge region of the phase shifting members, the phase shifting members have a gradually sloping surface which is formed by thermal treatment or such etching in which the phase shifting members are etched both perpendicularly and parallel to a top surface of the transparent substrate at one time. This enables less light intensity drop.

In the first aspect of the invention, according to the principles of the phase shift method, a high resolution is yielded where the first to the N-th phase shifting members are in a stack on the transparent substrate. On the other hand, where the K-th phase shifting member extends over the edge of the underlying (K−1)-th phase shifting member, decrease in the light intensity is suppressed so that the light intensity would not drop to zero. This allows arrangement of the phase shifting members all over the transfer pattern regardless of the configuration of the transfer pattern without exception, which in turn permits easy fabrication of a photomask which promises high-resolution pattern transfer and effectively prevents residual resist.

The manufacturing method of the second aspect of the invention comprises the step of making an edge region of the phase shifting members stacked on the transparent substrate less steep by thermal treatment. Hence, at that edge region, the phase shifting members are sloped less steep and drop in the light intensity sufficiently suppressed. Thus, the photomask obtainable according to the method of the second aspect promises high-resolution pattern transfer, effectively prevents residual resist, and requires less complex fabrication process.

In the third aspect of the invention, since the manufacturing method comprises the step of thermally treating the phase shifting members after formation of the N-th phase shifting member, thermal treatment is necessary less often during fabrication of a photomask. A photomask obtainable according to the method of the third aspect promises high-resolution pattern transfer and effectively prevents residual resist.

In the fourth aspect of the invention, the manufacturing method comprises the step of making the edge regions of the phase shifting members less steep by thermal treatment includes the step of performing thermal treatment once for formation of each one of the first to the N-th phase shifting members so that the N-th phase shifting member has a less steep edge. This makes it possible to easily manufacture a photomask which has a sufficiently less steep edge of a phase shifting member at which light intensity drop is small, and which promises a high resolution and effectively prevents residual resist.

In the fifth aspect of the invention, the manufacturing method comprises the step of making an edge region of the phase shifting member less steep by etching in which the phase shifting member are etched both perpendicularly and parallel to a top surface of the transparent substrate at one time. Hence, only a reduced number of fabrication steps is needed to manufacture a photomask which has a sufficiently less steep edge of a phase shifting member at which light intensity drop is small, and which promises a high resolution and effectively prevents residual resist.

In the sixth aspect of the invention, since the manufacturing method comprises the step of making an edge region of the phase shifting member which is formed on the transparent substrate less steep by thermal treatment, despite provision of no stack of phase shifting members, the edge region of the phase shifting member is less steep. Hence, sufficient suppression of light intensity drop is made possible at the edge region of the phase shifting member, yielding a high resolution and efficient prevention of residual resist. Such a photomask is fabricated easily according to the sixth aspect of the invention.

In the seventh aspect of the invention, the manufacturing method comprises the step of making an edge region of the phase shifting member less steep by etching in which the phase shifting member are etched both perpendicularly and parallel to a top surface of the transparent substrate at one time. Hence, it is possible to manufacture a photomask which has a sufficiently less steep edge of a phase shifting member at which light intensity drop is small, and which promises a high resolution and effectively prevents residual resist.

Accordingly, it is an object of the present invention to offer a photomask fabrication method which allows that phase shifting members are arranged entirely over a transfer pattern regardless of the configuration of the transfer pattern and hence which makes it possible that a pattern is transferred at a very high resolution.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 14A to 14C are explanatory diagrams showing the function of the conventional photomask;

FIGS. 29 and 30 are diagrams for explaining how a phase shifting member is changed when thermally treated;

DESCRIPTION OF THE PREFERRED EMBODIMENTS

FIGS. 1 to 6 are cross sectional views showing a method of manufacturing a photomask according to a first preferred embodiment of the present invention. First, FIG. 6 will be referred to in describing the structure of a photomask according to the first preferred embodiment.

Figure 6:
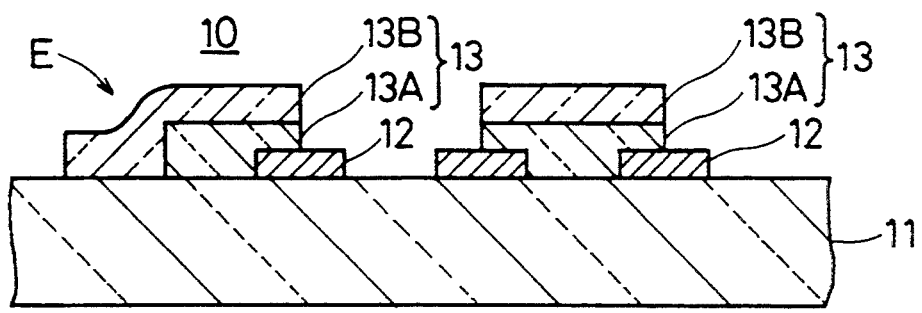
FIG. 6 is a cross sectional view showing the first preferred embodiment of the present invention.

A photomask 10 of FIG. 6 comprises a transparent substrate 11 made of glass or the like. On the transparent substrate 11, light shielding members 12 made of Cr, MoSi and the like are disposed in a periodic arrangement. The light shielding members 12 form a transfer pattern. The transfer pattern includes light shielding parts which correspond to where the light shielding members 12 are disposed and transparent parts which correspond to where the light shielding members 12 are not disposed, the light shielding parts and the transparent parts being disposed alternately. On every other transparent part, a phase shifting member 13 is formed which consists of a first phase shifting member 13A and a second phase shifting member 13B. The first and the second phase shifting members 13A and 13B are made of glass, for instance.

The first phase shifting members 13A each have a thickness which creates a phase difference of $\alpha$ degrees ($<180$ degrees) between light therethrough and light not therethrough. The second phase shifting members 13B each have a thickness which gives rise to a phase difference of $\beta$ degrees ($=180-\alpha$ degrees) between light therethrough and light not therethrough. This gives the phase shifting members 13 a characteristic that light therethrough and light otherwise are out of phase with each other by $\alpha+\beta$ degrees=180 degrees. The thickness may be set such that $\alpha=120$ degrees and $\beta=60$ degrees or such that $\alpha=\beta=90$ degrees.

In an edge region of the transfer pattern, at the portion indicated at the reference character E where an edge of the phase shifting member 13 is directly on the transparent substrate 11, the overlying second phase shifting member 13B extends over and onto the transparent substrate 11. The other edges of the first and the second phase shifting members 13A and 13B terminate at the same position on the light shielding member 12. It is to be noted, however, the other edges of the first and the second phase shifting members 13A and 13B need not to terminate precisely at the same position on the light shielding member 12 since the phase shifting members 13 are substantially ineffective on the light shielding member 12 (i.e., in the light shielding part).

Now, a method of manufacturing such a photomask according to a first preferred embodiment will be described with FIGS. 1 to 6.

Figure 1:
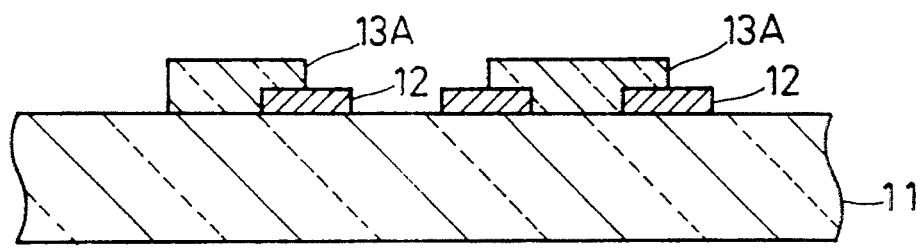
FIGS. 1 to 5 are cross sectional views showing a method of manufacturing a photomask according to a first preferred embodiment of the present invention.
Figure 15:
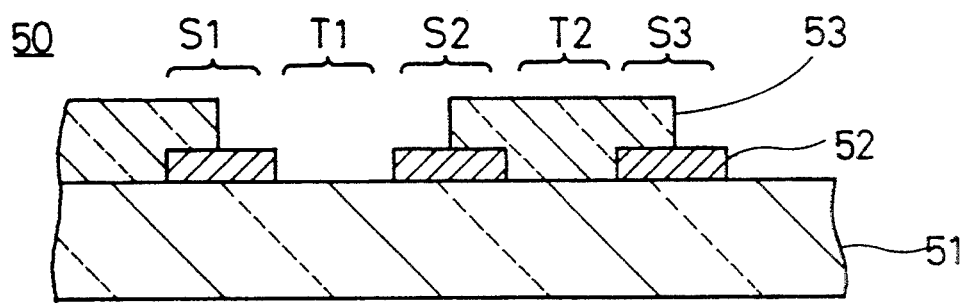
FIG. 15 is a cross sectional view of a photomask obtainable by a conventional phase shift method.
Figure 16:
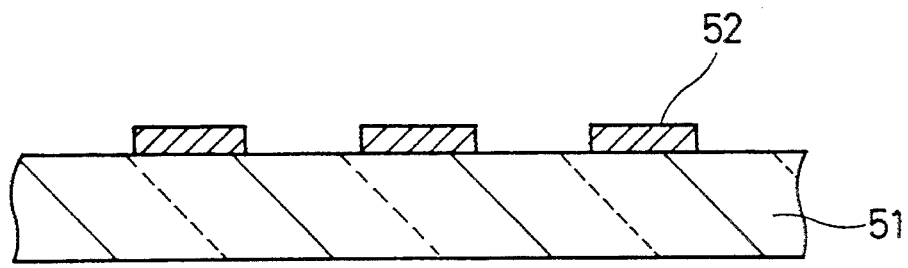
FIGS. 16 to 19 are cross sectional views showing the photomask obtainable by the conventional phase shift method during successive stages in the process of fabrication.
Figure 17:
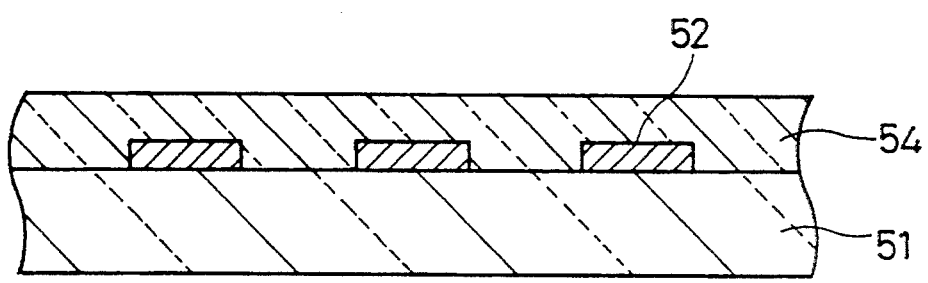
Figure 18:
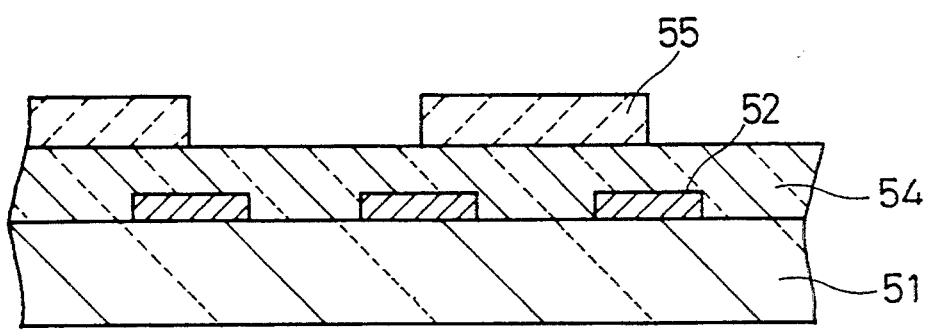
Figure 19:
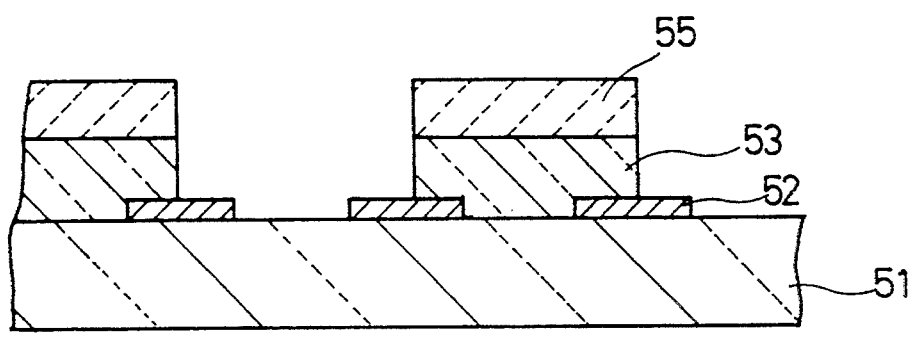

First, a photomask is prepared which includes the light shielding members 12 and the first phase shifting members 13A which are formed on the transparent substrate 11 as shown in FIG. 1. The photomask of FIG. 1 has the same structure as that of the photomask 50 of FIG. 15 which is obtainable by the conventional phase shift method. Hence, the photomask of FIG. 1 is manufactured through the fabrication steps which have been described with FIGS. 16 to 19. A difference here is the thickness of the first phase shifting members 13A thinner than the thickness of the conventional phase shifting members 53. Due to the difference, while the conventional phase shifting members 53 cause a 180-degree phase difference between light therethrough and light not therethrough, the first phase shifting members 13A of the first preferred embodiment create $\alpha$-degree phase difference ($\alpha<180$) between light therethrough and light not therethrough. The $\alpha$ degrees may be 120 degrees or 90 degrees as described earlier.

Figure 2:
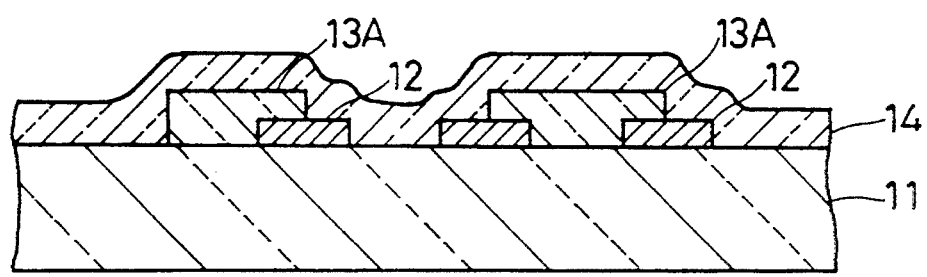

Next, as shown in FIG. 2, a transparent film 14 made of glass, for instance, is formed entirely on a top surface of the photomask of FIG. 1. The transparent film 14 has a thickness which causes that light therethrough and light not therethrough have therebetween a phase difference of $\beta$ degrees ($=180-\alpha$ degrees).

Figure 3:
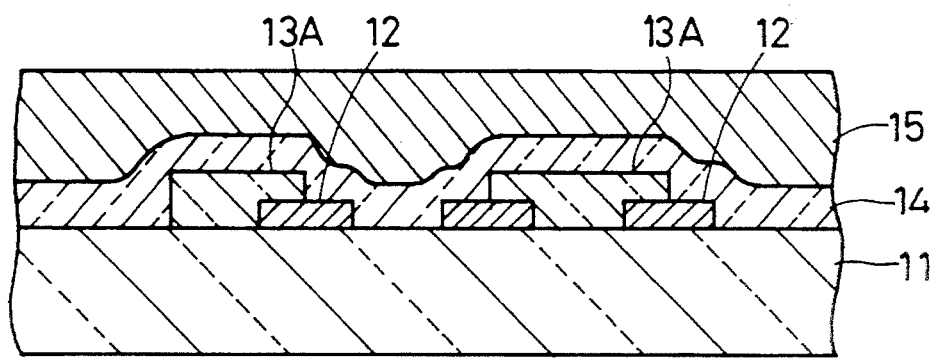

Following this, a resist layer 15 formed by an E-beam-sensitive resist layer and the like is formed an entire top surface of the transparent film 14 as shown in FIG. 3. A predetermined pattern is drawn (exposed) on the resist layer 15 by the E-beam exposure or other suitable method.

Figure 4:
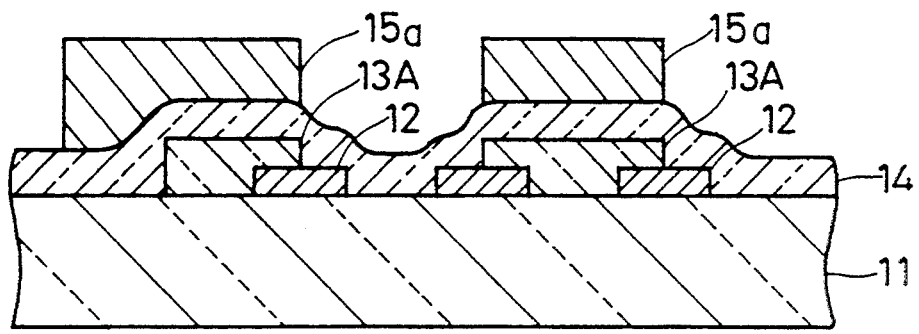

This is followed by development, whereby the resist layer 15 is defined into the predetermined pattern as shown in FIG. 4. Thus, a resist pattern 15a is formed in which the resist layers exist above only the first phase shifting members 13A. In the edge region of the transfer pattern (the transfer pattern of this photomask) which is formed by the light shielding patterns 12, the resist pattern 15a extends over an edge of the outermost first phase shifting member 13A.

Figure 5:
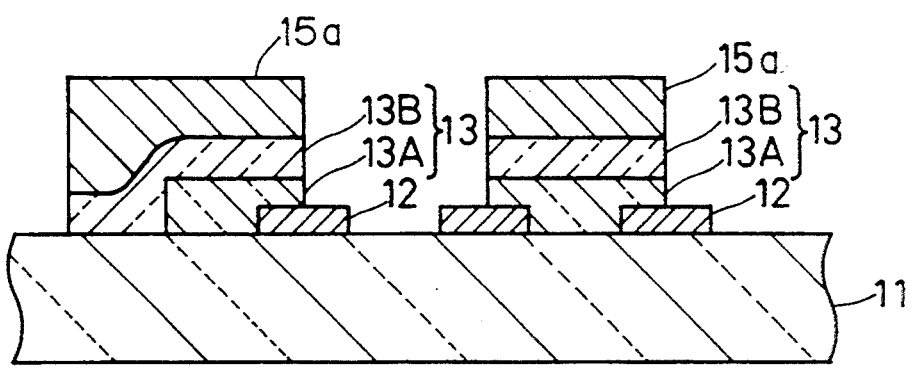

The transparent film 14 is then etched through the resist pattern 15a as shown in FIG. 5, patterning the second phase shifting members 13B. As a result, the phase shifting members 13 formed by the first and the second phase shifting members 13A and 13B are defined. The resist pattern 15a is then removed, completing the photomask 10 as that shown in FIG. 6.

Figure 7A:
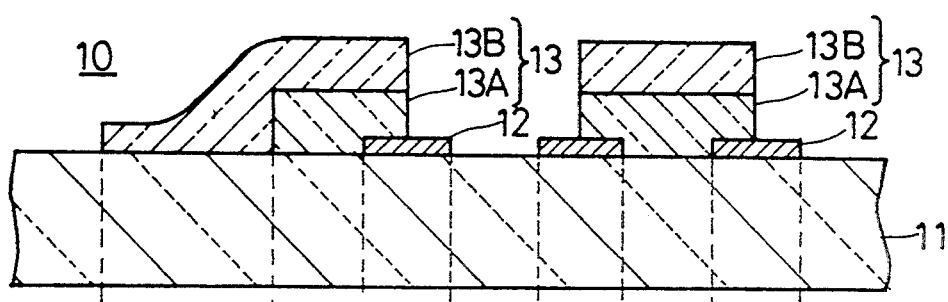
FIGS. 7A and 7B are explanatory diagrams showing the function of the photomask of the first preferred embodiment of the present invention.
Figure 7B:

In the photomask 10 of the first preferred embodiment, the phase shifting angle $\alpha$ of the first phase shifting members 13A and the phase shifting angle $\beta$ of the second phase shifting members 13B make 180 degrees. Hence, as shown in FIGS. 7A and 7B, in intermediate regions (a region between the light shielding members 12) of the transfer pattern of the photomask 10, a sharp change is created in the light intensity because of similar principles to those present in the photomask 50 (FIGS. 20A to 20C) which is obtainable by the conventional phase shift method. This enhances the resolution and hence allows highly accurate transfer of a fine pattern.

On the other hand, in an edge region of the transfer pattern of the photomask 10 (where an edge of the phase shifting member 13 is directly on the transparent substrate 11), as shown in FIG. 7B, the light intensity would not drop to as low as zero. Drop of the light intensity to zero at the edge of the transfer pattern, although unavoidable in the conventional photomask 50, is completely obviated. The reason is as follows. At the edge (left end) of the first phase shifting member 13A, the overlying second phase shifting member 13B has a gradually sloping top surface which causes gradual change in the phase shifting angle. Due to this gradual change in the phase shifting angle, only a relatively minor drop will be caused in the intensity of transmitted light. At the edge (left end) of the second phase shifting member 13B, the phase shifting angle is $\beta$ degrees ($<180$ degrees). Compared to where the phase shifting angle is 180 degrees as in the conventional photomask (FIGS. 20A to 20C), therefore, drop in the intensity of transmitted light here is also small.

Figure 9A:
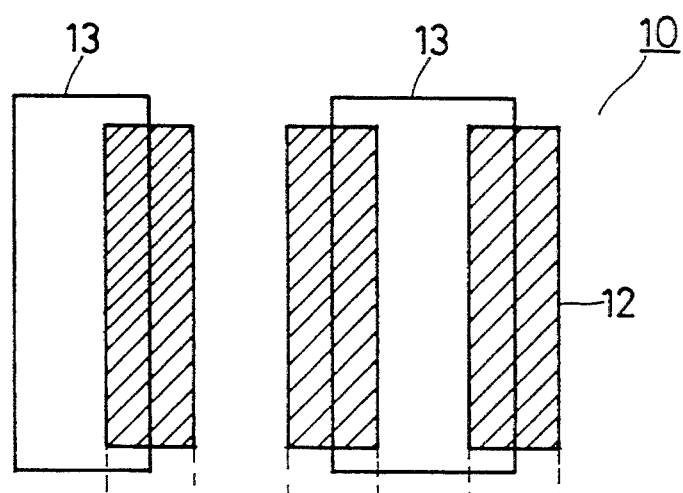
FIGS. 9A and 9B are explanatory diagrams showing the effect of the photomask of the present invention.
Figure 9B:
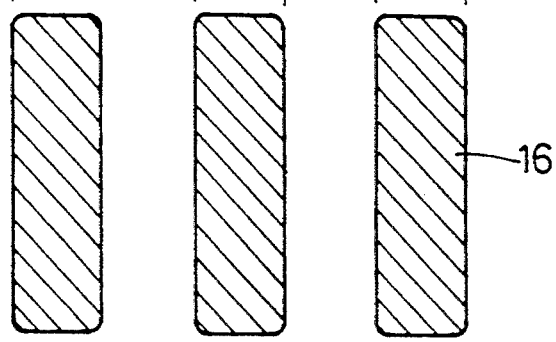
Figure 10:
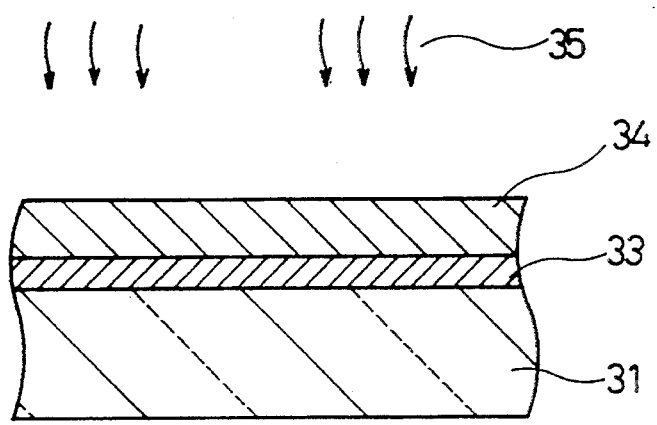
FIGS. 10 to 12 are cross sectional views showing a method of manufacturing a conventional photomask.
Figure 11:
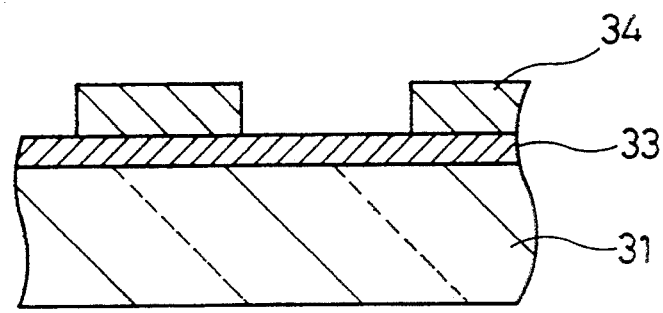
Figure 12:
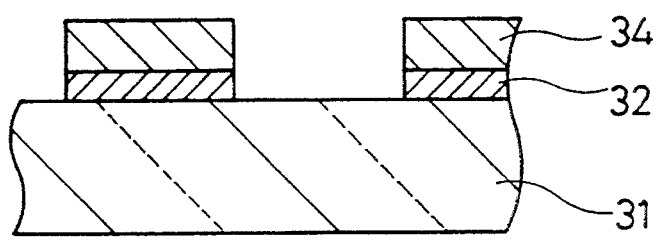
Figure 13:
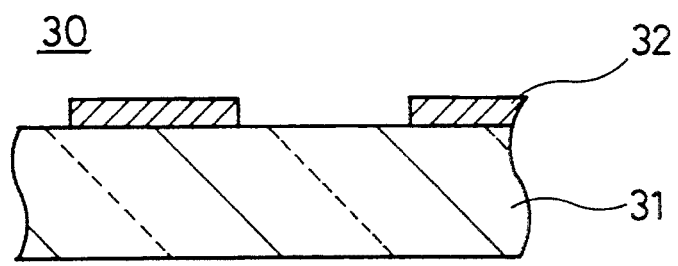
FIG. 13 is a cross sectional view showing the conventional photomask.
Figure 21A:
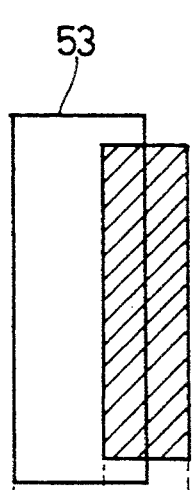
FIGS. 21A and 21B are explanatory diagrams showing a problem associated with the photomask obtainable by the conventional phase shift method.
Figure 21A:
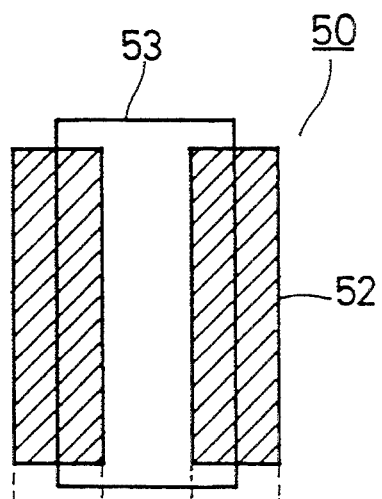
Figure 21B:
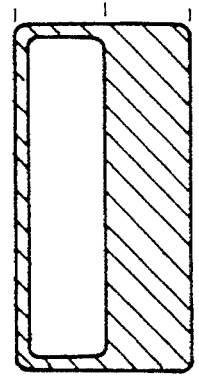
Figure 21B:
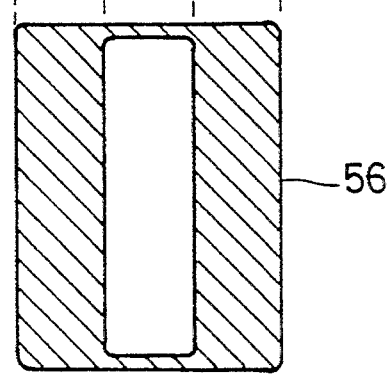

Hence, when the transfer pattern of the photomask 10 as that shown in FIG. 9A is transferred onto, for example, a positive resist 16 formed on a semiconductor substrate, unlike the conventional photomask 50 which inevitably produces unwanted residual resist as shown in FIG. 21B, the photomask 10 creates no residual resist at all as shown in FIG. 9B. Thus, with the photomask 10, a resist pattern as exactly desired is obtained.

Figure 8A:
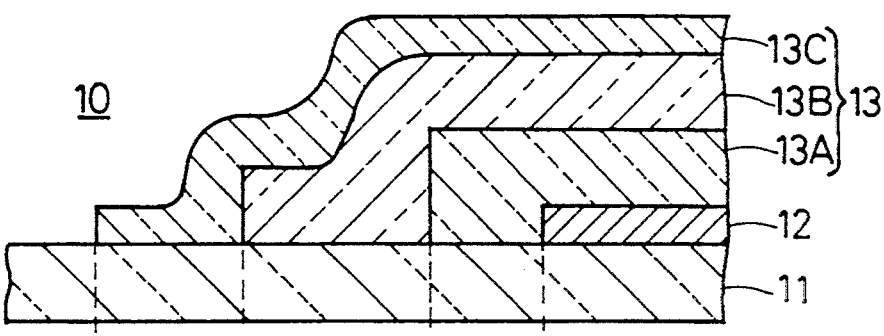
FIGS. 8A and 8B are explanatory diagrams showing the function of a photomask of a second preferred embodiment of the present invention.
Figure 8B:
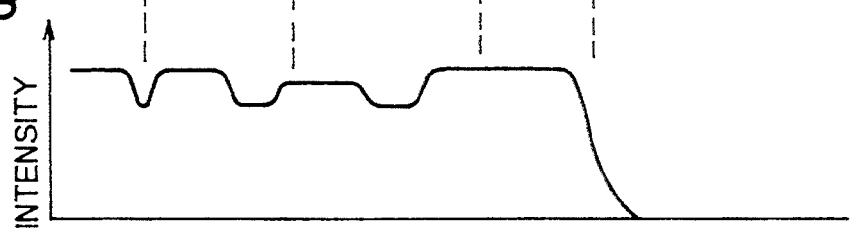

Although described as the double-layer structure formed by the first and the second phase shifting members 13A and 13B in the first preferred embodiment, the phase shifting members 13 each may be a multi-layer structure in which three or more layers are stacked. FIG. 8A shows a phase shifting member 13 of a triple-layer structure containing first to third phase shifting members 13A to 13C. The phase shifting angles $\alpha$, $\beta$ and $\Gamma$ of the first, the second and the third phase shifting members 13A, 13B and 13C are determined so as to satisfy $\alpha<180$ degrees, $\beta<180$ degrees, $\Gamma<180$ degrees, and $\alpha+\beta+\Gamma=180$ degrees. In the phase shifting member 13 constructed as such, too, drop of the light intensity to zero at the edge region of the transfer pattern is prevented (FIG. 8B).

Figures 20A, 20B, 20C:
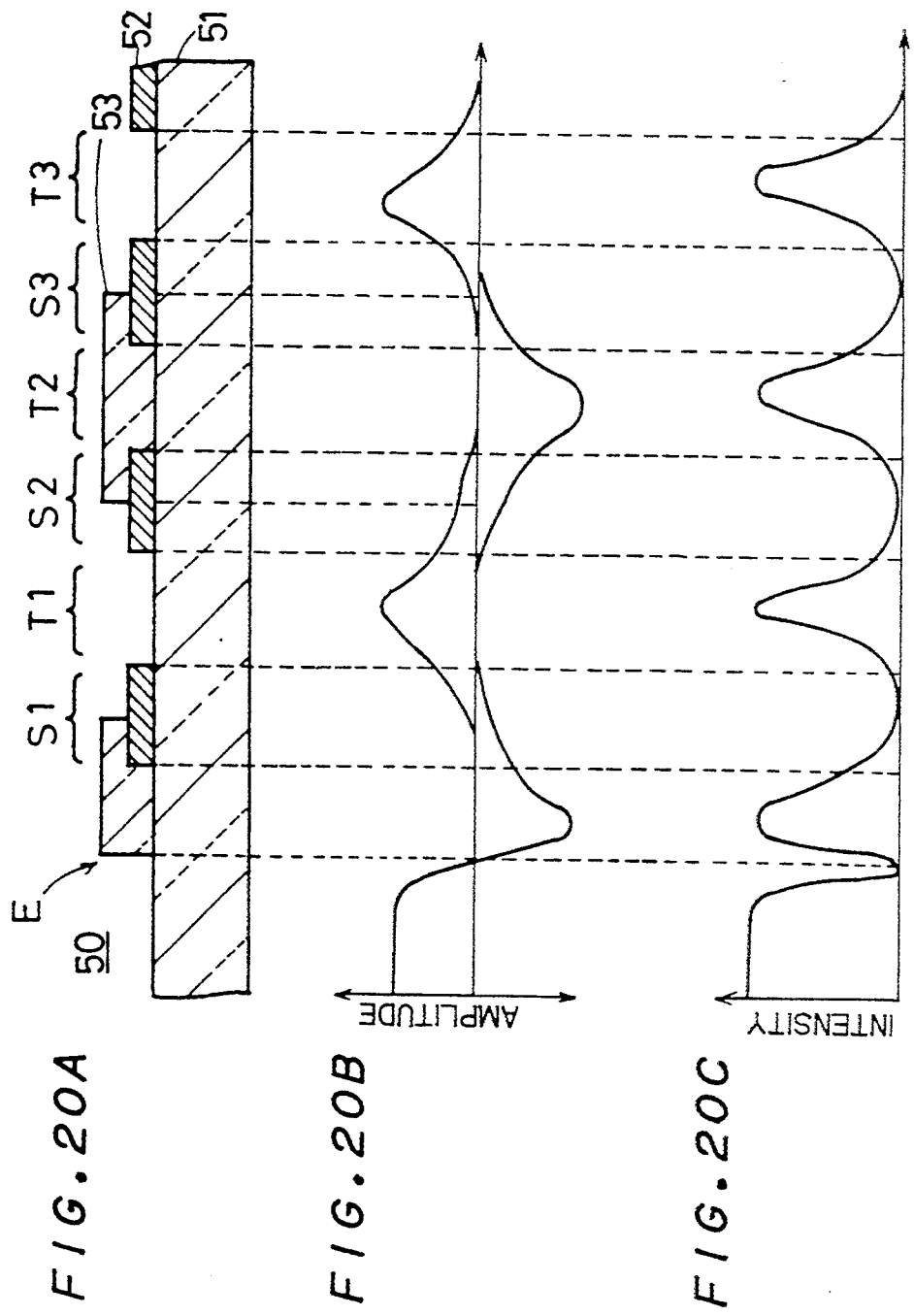
FIGS. 20A to 20C are explanatory diagrams showing the function of the photomask obtainable by the conventional phase shift method.

Next, description will be made on a photomask according to still other preferred embodiment and a method of fabricating such a photomask. As shown in FIG. 7B, in the first preferred embodiment, at the edge (left end) of the first phase shifting member 13A, the top surface of the overlying second phase shifting member 13B is gradually sloped, and therefore, the phase shifting angle thereat gradually changes, causing only a relatively small drop in the intensity of transmitted light. Further, since the phase shifting angle is $\alpha$ degrees ($<180$ degrees) at the edge (left end) of the second phase shifting member 13B, drop in the intensity of transmitted light here is smaller than where the phase shifting angle is 180 degrees as in the conventional photomask (FIGS. 20A to 20C). Hence, zero light intensity would not occur around the edge of the transfer pattern of the photomask 10 (where the edge of phase shifting member 13 is in direct contact with the transparent substrate 11).

It then follows that further reduction in the light intensity drop of the transmitted light is possible by forming a second phase shifting member 13B which is more moderately sloped toward its edge (sloping portion E of FIG. 6) and hence by further suppressing change in the phase shifting angle.

Figure 22:
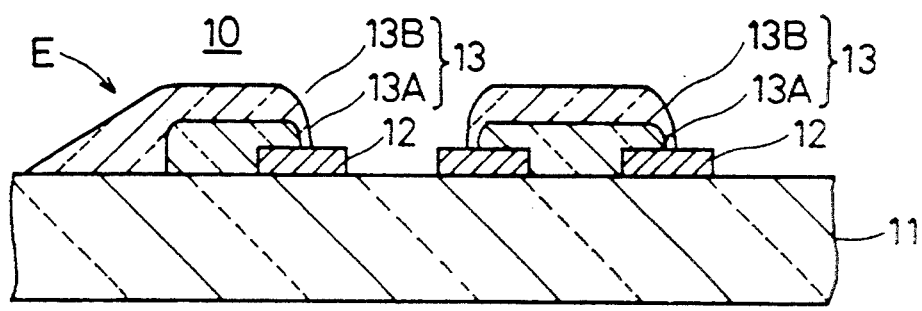
FIG. 22 is a cross sectional view showing a method of manufacturing a photomask according to a third preferred embodiment of the present invention.

This is attained in a photomask which is obtained according to a third preferred embodiment that is shown in FIG. 22. A method of fabricating the photomask will be also described with FIG. 22. First, the photomask 10 as that shown in FIG. 6 is prepared in a similar manner to that described in the first preferred embodiment. Following this, the photomask 10 is subjected to heat treatment at a temperature equal to or higher than the transition temperature $T_G$ of the glass material of the second phase shifting members 13B to fluidize the second phase shifting members 13B into a tapering-at-edge shape. As a result, the edge portion of the second phase shifting members 13B indicated at the reference character E has a gradually sloping configuration. The material of the second phase shifting members 13B includes: phosphoric glass (PSG), boron phosphoric glass (BPSG), and optical glass such as FSK1 ($T_G=465°$ C.), PK1 ($T_G=590°$ C.) and BK7 ($T_G=565°$ C.), for instance. Optical glass materials are especially suitable to form second phase shifting members 13B the since many of them are fluidized at a relatively low temperature (e.g., 400° to 600° C.) and exhibit an excellent transmission rate at around the exposure wavelength (365 nm).

The first and the second phase shifting members 13A and 13B may be and may not be made of the same material. For example, if the phase shifting members 13A are made of a material having a glass transition temperature $T_G$ which is higher than the glass transition temperature $T_G$ of the material of the second phase shifting members 13B, it is possible that only the second phase shifting members 13B are fluidized and the first phase shifting members 13A maintain their configurations.

Next, the structure and a fabrication method of a photomask according to a fourth preferred embodiment will be described with FIGS. 23 to 28. First, as the photomask of FIG. 1 is manufactured in the first preferred embodiment, a photomask in which the light shielding members 12 and the phase shifting members 13A are formed on the transparent substrate 11 is prepared.

Figure 23:
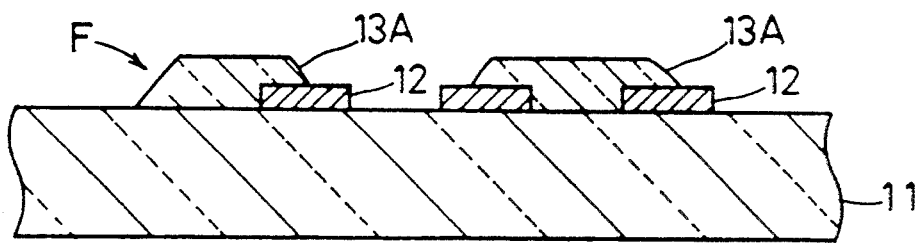
FIGS. 23 to 29 are cross sectional views a method of manufacturing a photomask according to a fourth preferred embodiment of the present invention.

The photomask is then thermally treated at a temperature equal to or higher than the transition temperature $T_G$ of the glass material of the first phase shifting members 13A as shown in FIG. 23, whereby fluidized first phase shifting members 13A each taper toward its edges. As a result, the edge region F of the first phase shifting members 13A has a gradually sloping shape.

Figure 24:
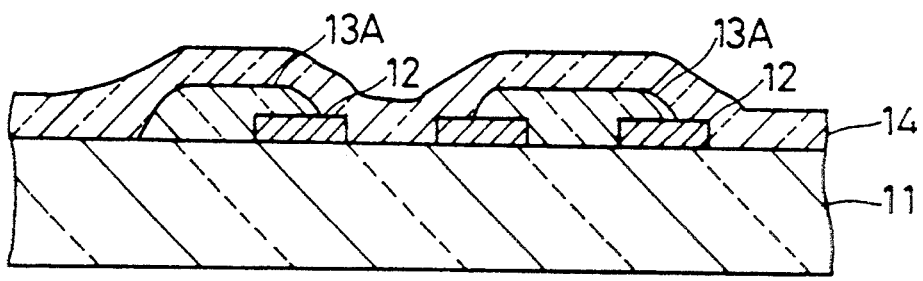

The photomask of FIG. 23 is thereafter entirely coated at a top surface with the transparent film 14 which is made of optical glass for example as shown in FIG. 24. The transparent film 14 has a thickness which creates a phase difference of $\beta$ degrees ($=180-\alpha$ degrees) between light therethrough and light otherwise.

Figure 25:
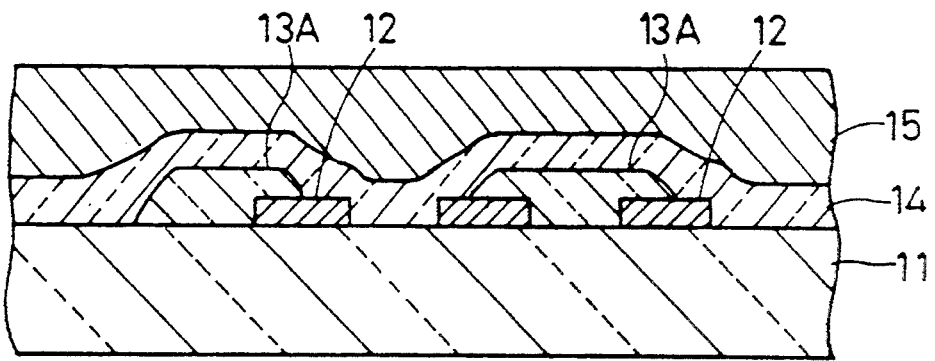

The resist layer 15 formed by E-beam-sensitive resist layer is then grown on the entire top surface of the transparent film 14 as shown in FIG. 25. A predetermined pattern is drawn (exposed) on the resist layer 15 by the E-beam exposure, for instance.

Figure 26:
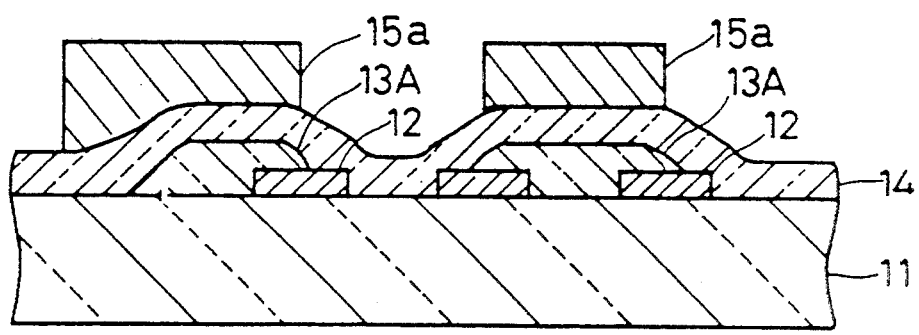

This is followed by development process by which the resist layer 15 is patterned into the predetermined pattern to become the resist pattern 15a as shown in FIG. 26. In the resist pattern 15a thus obtained, the resist layers remain only above the first phase shifting members 13A. At the edge region of the transfer pattern (the transfer pattern of the photomask) formed by the light shielding members 12, the resist pattern 15a extends over an edge of the outermost one of the first phase shifting members 13A.

Figure 27:
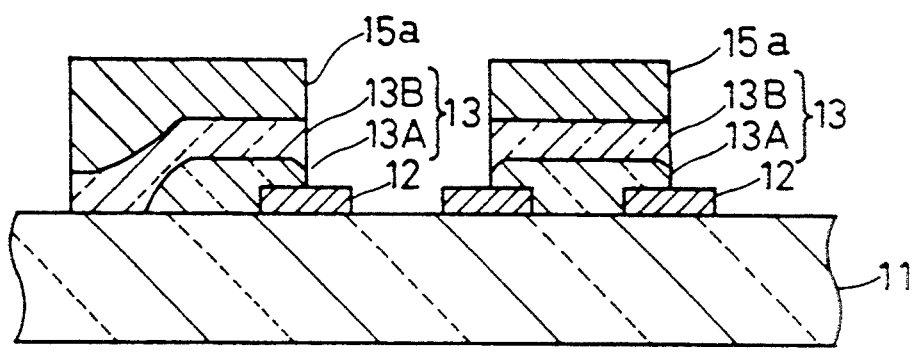
Figure 28:
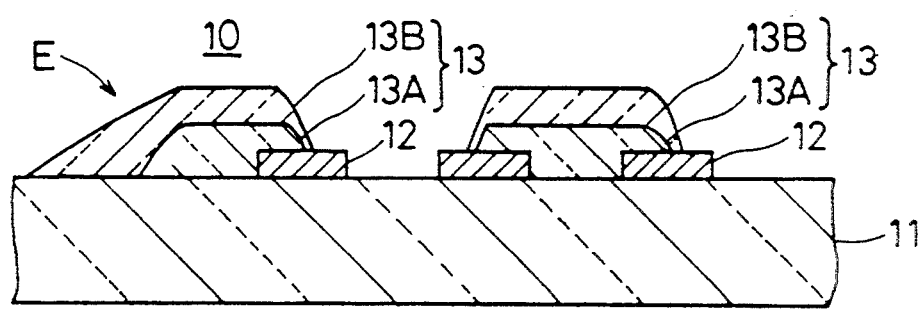

Next, as shown in FIG. 27, the transparent film 14 is etched through the resist pattern 15a, thereby patterning the second phase shifting members 13B and hence completing the phase shifting members 13 which are formed by the first and the second phase shifting members 13A and 13B. The resist pattern 15a is then removed and the photomask is subjected to thermal treatment at a temperature equal to or higher than the transition temperature $T_G$ of the glass material of the second phase shifting members 13B. As a result, the photomask 10 as that shown in FIG. 28 is obtained. Since the first phase shifting member 13A has a tapering configuration at the edge region of the photomask 10 indicated at E in FIG. 28, change in the phase shifting angle and hence drop in the intensity of the transmitted light are smaller than at the edge region E of the second phase shifting members 13B of the photomask 10 of FIG. 22.

If the phase shifting members 13 are formed by the first phase shifting members 13A alone instead of being formed as a multi-layer structure, the fabrication step shown in FIG. 23 completes manufacturing of the phase shifting members 13. In such a case, since the phase shifting members 13 are to be formed by only first phase shifting members 13a, the thickness of the first phase shifting members 13a must be determined to create a phase shifting angle of 180 degrees. However, the light intensity at the edges would not largely drop since the first phase shifting members 13A have tapering edges, and therefore, residual resist would not be created.

Figure 29:
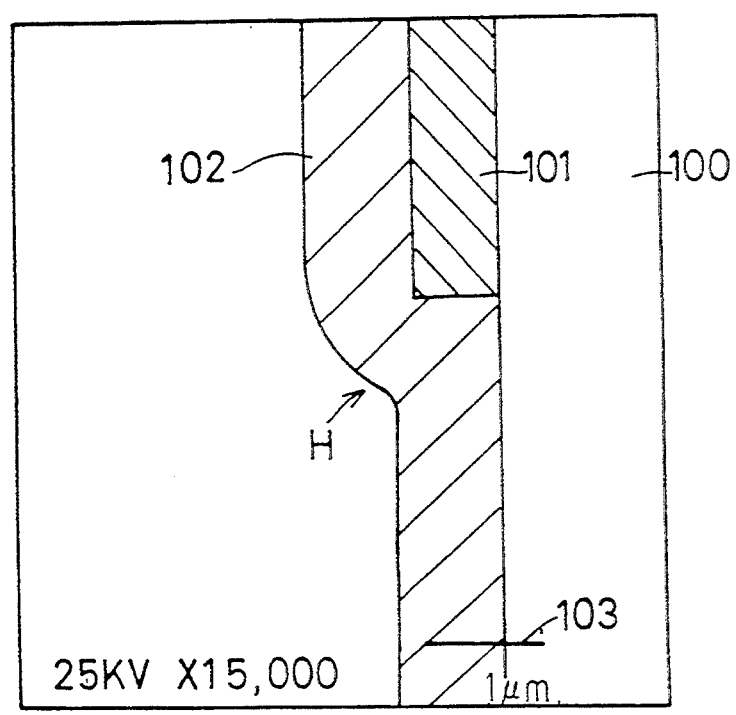
Figure 30:
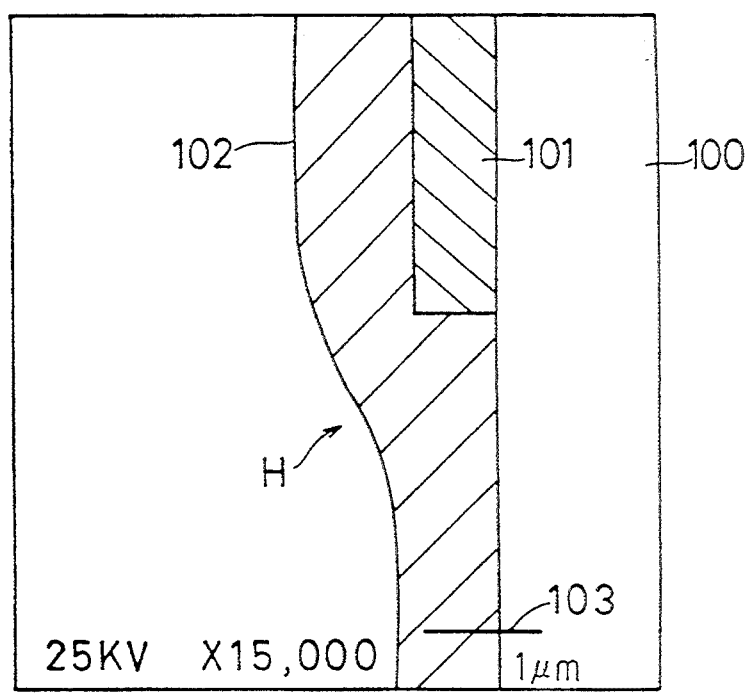

The thermal treatment mentioned above will now be described with FIGS. 29 and 30. On a transparent substrate 100 provided thereon with a light shielding member 101, a sample is formed which includes a film 102 which is made of a phase shifting material, i.e., PSG (phosphorus concentration 3 to 9 wt %) or BPSG (boron concentration 2 to 4 wt %; phosphorus concentration 3 to 9 wt %). In FIG. 29, a picture of a cross section of the sample photographed with a SEM (scanning electron microscope) is diagrammatized. The sample as shown in FIG. 29 is thermally treated at a temperature ranging from 700° to 900° C. A cross section of the sample after the thermal treatment as it is seen in a photograph taken with a SEM is shown in FIG. 30. The acceleration voltage of electrons is 25 KV and the magnification is 5000. The lines 103 in FIGS. 29 and 30 are 1 μm. As can be seen in FIGS. 29 and 30, the portion H is less steep after the thermal treatment.

Figure 31:
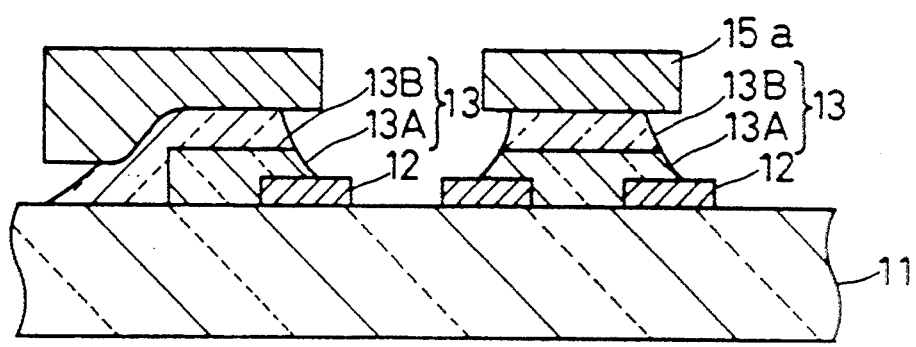
FIGS. 31 and 32 are cross sectional views a method of manufacturing a photomask according to a fifth preferred embodiment of the present invention.
Figure 32:
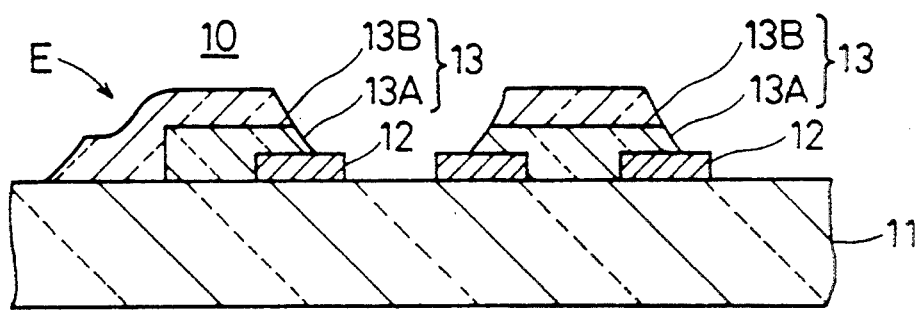

Next, the structure and a fabrication method of a photomask according to a fifth preferred embodiment will be described with FIG. 31. Fabrication of the photomask up to the stage shown in FIG. 4 is similar to that in the first preferred embodiment. The subsequent etching is not anisotropic etching as in the first preferred embodiment but is isotropic etching. In the isotropic etching, the second phase shifting members 13B are etched under the resist pattern 15a as shown in FIG. 31. The resist pattern 15a is then removed, leaving the outermost second phase shifting member 13B having a gradually sloping edge indicated at the reference character E in FIG. 32.

When the second phase shifting members 13B are formed by a silicon nitride film Si₃N (Si$_x$N$_x$), heated concentrated phosphoric acid H₃PO₄ (P₂O₅. nH₂O) is used as etching solution. When the second phase shifting members 13B are made of SiO₂, hydrofluoric acid HF (1 to 15%) is used as etching solution. In the latter case, though the substrate is also made of SiO₂, since quartz glass is used, selective etching is made possible by using SOG and the like for the material of the second phase shifting members 13B.

Figure 33:
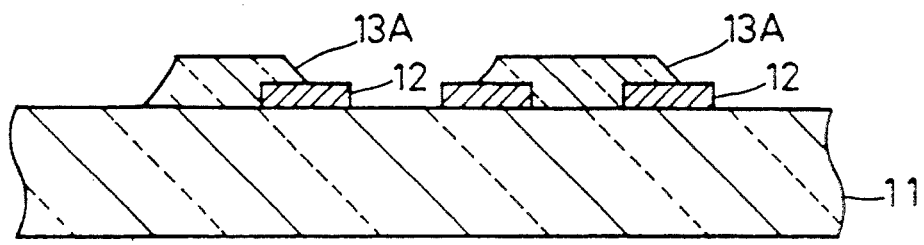
FIGS. 33 to 38 are cross sectional views a method of manufacturing a photomask according to a sixth preferred embodiment of the present invention.

The structure and a fabrication method of a photomask according to a sixth preferred embodiment will be now described with FIGS. 33 to 38. First, by carrying out isotropic etching as in the fourth preferred embodiment, the photomask as that shown in FIG. 33 is obtained in which the light shielding members 12 and the phase shifting members 13A are formed on the transparent substrate 11.

Figure 34:
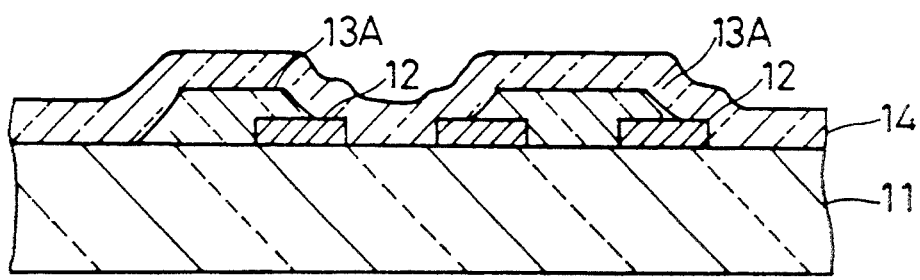

The photomask of FIG. 33 is thereafter entirely coated at a top surface with the transparent film 14 which is made of, for example, optical glass as shown in FIG. 34. The transparent film 14 has a thickness which creates a phase difference of β degrees (=180−α degrees) between light therethrough and light not therethrough.

Figure 35:
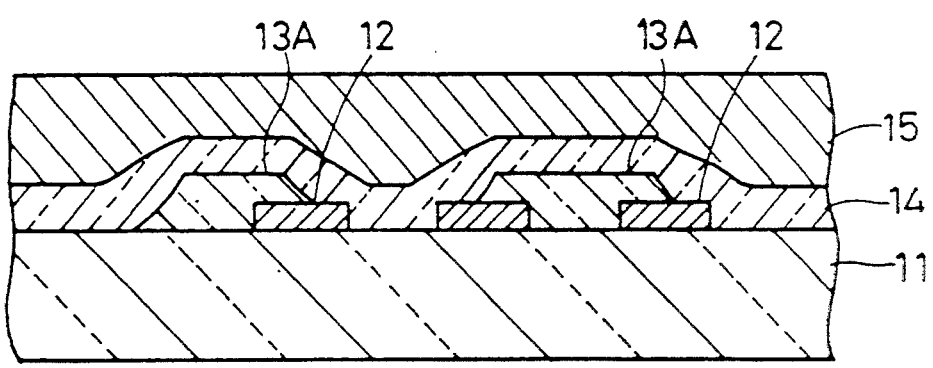

The resist layer 15 formed by E-beam-sensitive resist layer is then grown on the entire top surface of the transparent film 14 as shown in FIG. 35. A predetermined pattern is drawn (exposed) on the resist layer 15 by the E-beam exposure, for instance.

Figure 36:
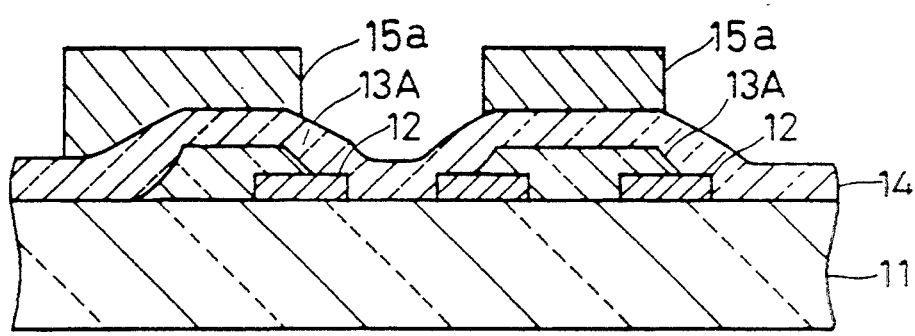

This is followed by development process by which the resist layer 15 is patterned into the predetermined pattern to become the resist pattern 15a (FIG. 36). In the resist pattern 15a thus obtained, the resist layers remain only above the first phase shifting members 13A. At the edge region of the transfer pattern formed by the light shielding members 12 (the transfer pattern of the photomask), the resist pattern 15a extends over an edge of the outermost one of the first phase shifting members 13A.

Figure 37:
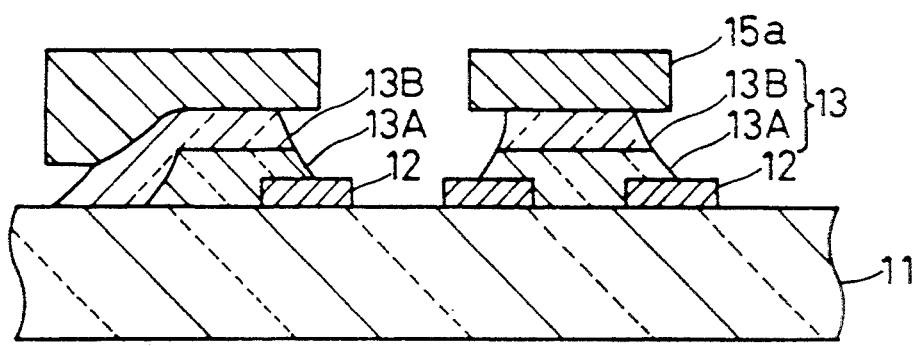
Figure 38:
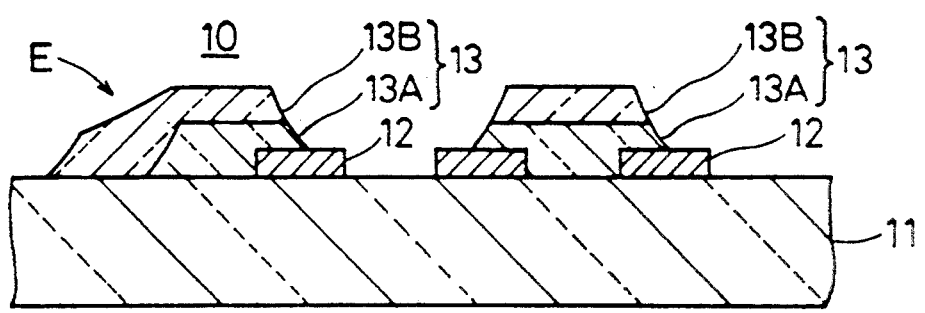

Next, as shown in FIG. 37, the transparent film 14 is isotropically etched through the resist pattern 15a, thereby patterning the second phase shifting members 13B and hence completing the phase shifting members 13 each formed by the first and the second phase shifting members 13A and 13B. The resist pattern 15a is then removed so that the photomask 10 as that shown in FIG. 38 is formed. Since the first phase shifting member 13A has a tapering configuration at the edge region of the photomask 10 indicated at E in FIG. 38, change in the phase shifting angle and hence drop in the intensity of the transmitted light are smaller than at the edge region E of the second phase shifting members 13B of the photomask 10 of FIG. 22. Combinations of the materials of the first and the second phase shifting members 13A and 13B and etching solution remain the same as those in the fifth preferred embodiment.

If the phase shifting members 13 are formed by the first phase shifting members 13A alone instead of being formed in a multi-layer structure, the fabrication step shown in FIG. 33 completes manufacturing of the phase shifting members 13. In such a case, since the phase shifting members 13 are to be formed by only first phase shifting members 13a, the thickness of the first phase shifting members 13a must be determined to create a phase shifting angle of 180 degrees. However, the light intensity at the edges would not largely drop since the first phase shifting members 13A have tapering edges, and therefore, residual resist would not be created.

The third to the sixth preferred embodiments have been described in relation to the phase shifting members 13 of a single- or double-layer structure. This of course is not intended to preclude a triple- or more layer structure which promises similar effects.

Now, the intensity of two light beams interfering with each other is briefly discussed. In general, if the two light beams $U_1$ and $U_2$ satisfy:

$$U_1 = a_1 \cdot \sin(\omega t + \theta_1) \quad U_2 = a_2 \cdot \sin(\omega t + \theta_2) \tag{1}$$

a composite profile U is:

$$U = U_1 + U_2 = a \cdot \sin(\omega t + \theta) \tag{2}$$

$$a = \sqrt{a_1^2 + a_2^2 + 2a_1 a_2 \cdot \cos(\theta_1 - \theta_2)}$$

$$\tan\theta = \frac{a_1 \cdot \cos\theta_1 + a_2 \cdot \sin\theta_2}{a_1 \cdot \cos\theta_1 + a_2 \cdot \cos\theta_2}$$

As to the intensity of a light beam which has passed through a certain point on a mask, attention is to be directed to a fact that the intensity of light is a square of the amplitude. The amplitude is interference in fine areas and dependent on the wavelength and the numerical aperture of a projection optical system. Assuming that the amplitude $a_x$ at a point X is composite intensity of intensities at fine areas $-\Delta X$ and $+\Delta X$ for simplicity of description, the following relation is satisfied:

$$a_X = \sqrt{a^2_{-\Delta X} + a^2_{+\Delta X} + 2a_{-\Delta X}a_{+\Delta X}\cos(\theta_{-\Delta X} - \theta_{+\Delta X})} \quad (3)$$

In a region where the phase exhibits a continuous change, the phase in each fine area is regarded constant, and therefore, the amplitude is defined as Eq. 3. Hence, the amplitude becomes maximum when there is no phase difference between the fine areas, i.e., when $\theta-\Delta X=\theta+\Delta X$. When the phase difference is 180 degrees, the amplitude becomes minimum. When the phase difference is 90 degrees or less, the light intensity becomes ½ or larger.

As described above, by forming the edge region of the shifter in a tapering configuration, drop in the light intensity is suppressed. Light intensity drop is better restrained since a phase difference between fine areas become smaller as the tapering configuration is less steep.

While the invention has been described in detail, the foregoing description is in all aspects illustrative and not restrictive. It is understood that numerous other modifications and variations can be devised without departing from the scope of the invention.

I claim:

1. A method of manufacturing a photomask, comprising the steps of:
    preparing a transparent substrate which is pervious to light;
    selectively forming a light shielding member which is impervious to light on said transparent substrate; and
    forming a phase shifting member adjacent to said light shielding member and on said transparent substrate, said phase shifting member shifting the phase of light which is transmitted therethrough,
    wherein said step of forming said phase shifting member includes the steps of stacking first to N-th phase shifting members in this order on said transparent substrate where N is an integer larger than 2 in such a manner that in a region not adjacent to said light shielding member, an edge of a K-th phase shifting member extends over an edge of a (K−1)-th phase shifting member and onto said transparent substrate where K is an integer satisfying $2 \leq K \leq N$, and
    the phase shifting angles of said first to said N-th phase shifting members are each smaller than 180 degrees but equal to 180 degrees in total.

2. The method of claim 1, wherein said step of stacking first to N-th phase shifting members in this order on said transparent substrate includes the step of making an edge region of said phase shifting members stacked on said transparent substrate less steep by thermal treatment.

3. The method of claim 2, wherein said step of making the edge region of said phase shifting members less steep by thermal treatment includes the step of thermally treating said phase shifting members after formation of said N-th phase shifting member.

4. The method of claim 3, wherein a material of said N-th phase shifting member includes optical glass.

5. The method of claim 2, wherein said step of making the edge region of said phase shifting members less steep by thermal treatment includes the step of performing thermal treatment once after formation of each one of said first to said N-th phase shifting members so that each one of said first to said N-th phase shifting members has a less steep edge.

6. The method of claim 5, wherein a material of said first to said N-th phase shifting members includes optical glass.

7. The method of claim 1, wherein said step of stacking first to N-th phase shifting members in this order on said transparent substrate includes the step of making the edge region of said phase shifting members less steep by etching in which said phase shifting members are etched both perpendicularly and parallel to a top surface of said transparent substrate at one time.

8. The method of claim 7, wherein said step of making the edge region of said phase shifting members less steep by etching includes the steps of:
    forming a film for use in formation of said N-th phase shifting member;
    forming a resist pattern on said film for use in formation of said N-th phase shifting member; and
    performing etching which uses said resist pattern as a mask and in which said phase shifting members are etched both perpendicularly and parallel to a top surface of said transparent substrate at one time, whereby said N-th phase shifting member is formed to have a less steep edge.

9. The method of claim 8, wherein said etching includes isotropic etching.

10. The method of claim 7, wherein said step of making the edge region of said phase shifting members less steep by etching includes the steps of:
    forming said first to said N-th phase shifting members in this order;
    forming a film for use in formation of said first to said N-th phase shifting members;
    forming a resist pattern on said film for use in formation of said first to said N-th phase shifting members; and
    performing etching which uses said resist pattern as a mask and in which said phase shifting members are etched both perpendicularly and parallel to a top surface of said transparent substrate at one time, whereby said first to said N-th phase shifting members are each formed to have a less steep edge.

11. The method of claim 10, wherein said etching includes isotropic etching.

12. A method of manufacturing a photomask, comprising the steps of:
    preparing a transparent substrate which is pervious to light;
    selectively forming a light shielding member which is impervious to light on said transparent substrate;
    forming a phase shifting member adjacent to said light shielding member and on said transparent substrate, said phase shifting member shifting the phase of light which is transmitted therethrough;
    wherein said step of forming said phase shifting member includes the steps of stacking first to N-th phase shifting members in this order on said transparent substrate where N is an integer larger than 2 in such a manner that in a region not adjacent to said light shielding member, an edge of a K-th phase shifting member extends over an edge of a (k−1)-th phase shifting member and onto said transparent substrate where K is an integer satisfying $2 \leq K \leq N$; and making an edge region of said phase shifting member less steep by thermal treatment.

13. The method of claim 12, wherein said phase shifting member includes a phase shifting material light through which is 180 degrees out of phase from light not through said phase shifting material.

14. The method of claim 13, wherein a material of said phase shifting member includes optical glass.

15. A method of manufacturing a photomask, comprising the steps of:

preparing a transparent substrate which is pervious to light;

selectively forming a light shielding member which is impervious to light on said transparent substrate;

forming a phase shifting member adjacent to said light shielding member and on said transparent substrate, said phase shifting member shifting the phase of light which is transmitted therethrough;

wherein said step of forming said phase shifting member includes the steps of stacking first to N-th phase shifting members in this order on said transparent substrate where N is an integer larger than 2 in such a manner that in a region not adjacent to said light shielding member, an edge of a K-th phase shifting member extends over an edge of a (k−1)-th phase shifting member and onto said transparent substrate where K is an integer satisfying $2 \leq K \leq N$; and making an edge region of said phase shifting member less steep by etching in which said phase shifting member are etched both perpendicularly and parallel to a top surface of said transparent substrate on one time.

16. The method of claim 15, wherein said phase shifting member includes a phase shifting material light through which is 180 degrees out of phase from light not through said phase shifting material.

17. The method of claim 16, wherein said etching includes isotropic etching.

* * * * *